April 10, 1956 J. J. IFFLAND 2,741,668

STABILIZED AMPLIFIER

Filed Nov. 21, 1952 3 Sheets-Sheet 1

INVENTOR
JOHN J. IFFLAND

April 10, 1956 J. J. IFFLAND 2,741,668

STABILIZED AMPLIFIER

Filed Nov. 21, 1952 3 Sheets-Sheet 2

INVENTOR.
JOHN J. IFFLAND

BY

Lockwood, Galt, Woodard, & Smith
ATTORNEYS

April 10, 1956 J. J. IFFLAND 2,741,668

STABILIZED AMPLIFIER

Filed Nov. 21, 1952 3 Sheets-Sheet 3

INVENTOR
JOHN J. IFFLAND

BY

ATTORNEY

United States Patent Office 2,741,668

Patented Apr. 10, 1956

2,741,668

STABILIZED AMPLIFIER

John J. Iffland, Fort Wayne, Ind., assignor to International Telephone and Telegraph Corporation, a corporation of Maryland Application November 21, 1952, Serial No. 321,873

8 Claims. (Cl. 179—171)

The present invention relates to stabilizing control circuits for direct coupled amplifiers, and more particularly to a circuit for automatically stabilizing direct coupled amplifiers against zero offset voltage and voltage drifting.

In electronic amplifiers for use in amplifying direct current voltages or low frequency voltages, the fact that the output signal of the amplifier does not accurately correspond to the input signal is well known. Also, the reasons for this unstable relationship between the input and output signals are well known and include such things as shifts in power supply voltages, changes in cathode temperature and emission, variations in values of circuit resistances, and other variations of circuit characteristics. When such amplifiers are used to amplify D. C. voltages, it is, of course, desirable that if zero voltage is fed into the amplifier, zero voltage appear in the output circuit. However, the difficulty often encountered with the conventional type of amplifier is that with zero voltage input, a measurable voltage output is derived, and this voltage output may be characterized as "drift" voltage.

Several expedients have heretofore been offered for stabilizing direct current amplifiers, one of these being the compensation of drifting by means of manual adjustments. Another proposal has been to use a mechanical chopper to change the drift voltage into alternating voltage, and to amplify this alternating voltage by means of an auxiliary amplifier which produces a signal useable to offset the drift condition. In general, the mechanical chopper-auxiliary amplifier combination has been used to produce a signal having a magnitude dependent upon the magnitude of the drift voltage and which is fed back into the input of the amplifier circuit in such phase relation as to equalize and remove the drift voltage. The output voltage of such a stabilized system will follow accurately the parameter of the input signal.

The object of the present invention, therefore, is to provide a novel method and means for stabilizing the amplifier with a relatively simple control circuit which is characterized by the fact that it does not include an auxiliary amplifier.

It is another object of this invention to provide a stabilized direct coupled amplifier which utilizes the main amplifier circuitry for providing a correcting signal which may be used to compensate for inherent amplifier drift conditions.

A still further object of this invention is to provide a stabilized direct coupled amplifier which incorporates a mechanical chopper for sampling any drift voltages and for feeding the sampled voltages back into the main amplifier which are then used in effecting stabilization.

In accordance with the present invention, there is provided an amplifier comprising three direct coupled stages. A first feed-back impedance is coupled between the input circuit of the first stage and the output circuit for the third stage, and a second feed-back impedance is connected between the output circuit of the second stage and a second input circuit to the first stage. A mechanical chopper is cooperatively arranged with respect to both of the feed-back impedances for sampling any drift voltages developed in the amplifier stages and to cause these sample voltages to be fed back into the input stage where a correcting effect is produced.

For a better understanding of the invention, together with other and further objects thereof, reference is made to the following description taken in connection with the accompanying drawings and its scope will be pointed out in the appended claims.

In the drawings

Figure 1:
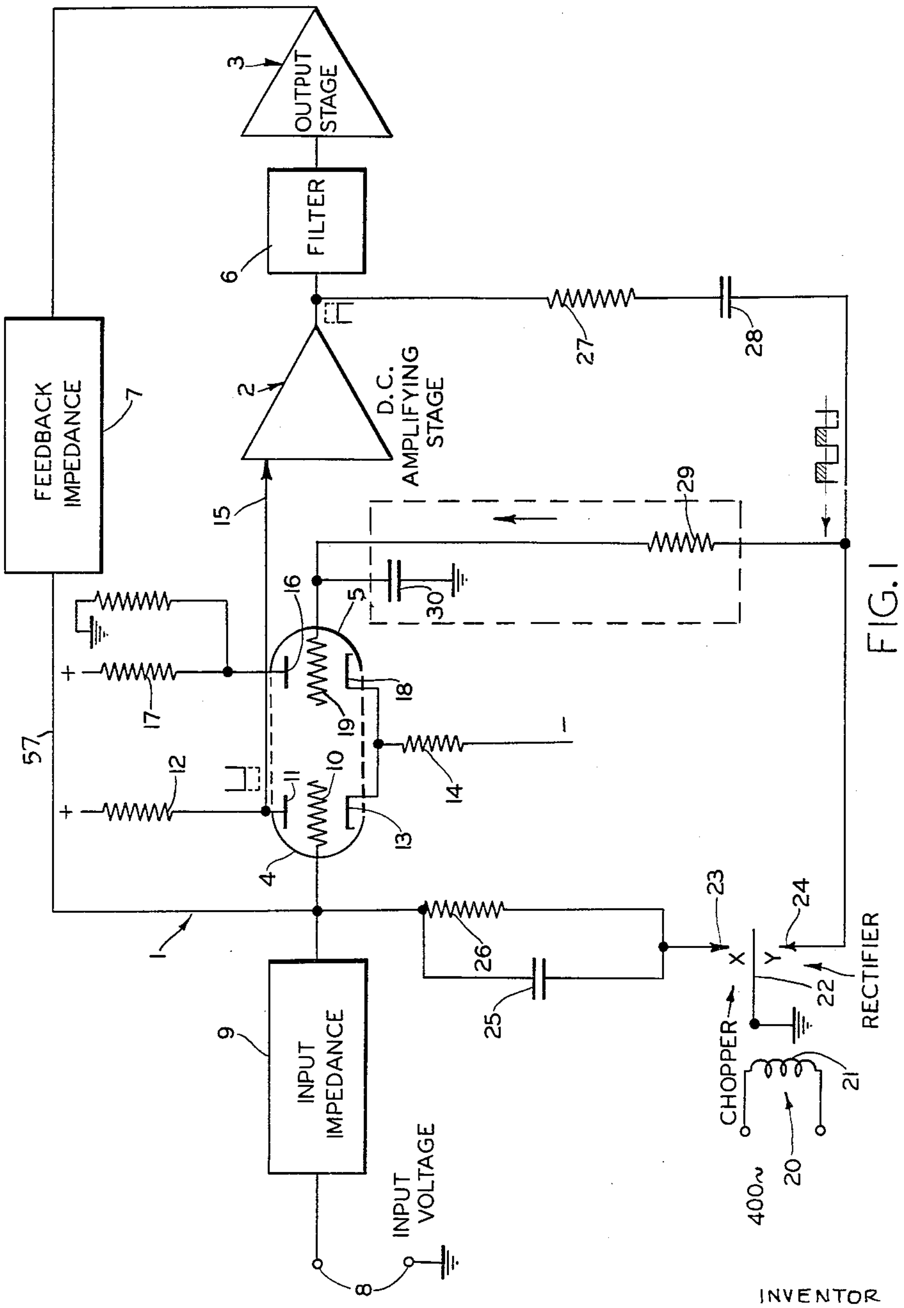
Fig. 1 is a diagrammatic illustration shown partly in block diagram of an embodiment of this invention.

Referring now to Fig. 1 of the drawings, there is shown an amplifier circuit comprising three stages 1, 2, and 3, respectively, which are directly coupled together in the conventional manner. In general, amplifier stage 1 is comprised of two triode sections or tubes 4 and 5, tube 4 being directly coupled to amplifier stage 2. The direct coupling between the stages 2 and 3 includes a filter 6 which serves a purpose to be explained more fully hereafter. A feed-back impedance 7 which may consist essentially of either a resistive, inductive, or capacitive component, or a combination thereof, is coupled between the stages 1 and 3 for feeding a sample of the output signal of the stage 3 back into the input circuit of the first stage.

The primary input circuit 8 is coupled by means of a suitable input impedance 9, either resistive, inductive, or capactive, to the control grid 10 of the triode 4. The anode 11 of this triode 4 is connected to a suitable source of B plus voltage by means of a resistor 12, and the cathode 13 is coupled to a suitable source of negative voltage by means of a cathode resistor 14. The signal from the tube 4 is taken from the anode 11 by the connection 15 which leads to the amplifier stage 2.

The anode 16 of the triode 5 is also connected to a suitable source of B plus potential by means of a resistor 17. The cathode 18 is connected to the cathode 13 of the tube 4 whereby the cathode resistor 14 serves both cathodes. The control grid 19 of tube 5 is coupled into the overall circuit in a manner which is described hereafter. A synchronous switch or a synchronous chopper and rectifier combination, generally indicated by the reference numberal 20, is comprised essentially of an electro-magnet 21 which is connected to a suitable source of A. C. voltage such as 400 cycles. An armature 22 is mounted so as to be vibrated by the magnet 21 between two fixed contacts 23 and 24. The armature 22 is grounded, so that when the armature is in contact with the point 23, this point will of course be grounded, and conversely when the armature is moved in the opposite direction to engage the contact 24, this latter contact will be grounded. The combination of the armature 22 and the contact 23 may be conveniently characterized as the mechanical chopper part of this construction, while the combination of the armature 22 and contact 24 may be characterized as the rectifier portion of this construction. The method of operation will be described more fully hereafter.

A coupling network consisting of a condenser 25 connected in parallel with the resistor 26 is used to couple the fixed contact 23 to the control grid 10 of the tube 4.

The output circuit of the amplifier stage 2 is connected to the fixed contact 24 through a phase correction network consisting of a series connected resistor 27 and condenser 28, another resistor 29 serving to connect contact 24 to grid 19 of tube 5. A condenser 30 is connected between this grid 19 and ground. In operation, the resistor 29 and the condenser 30 function as a low pass filter for providing a direct current signal voltage for the grid 19.

Having now described the illustrated embodiment of this invention in general detail, the operation of the invention will now be explained. Assuming that a positive signal voltage is impressed across the input circuit 8, this input voltage will be coupled to the control grid 10 of the tube 4 by the input impedance 9. By the presence of this positive signal on the grid 10, the tube 4 now conducts thereby lowering the tube resistance and the effective anode 11 potential. The signal resulting from the change in anode potential is coupled to amplifier stage 2 which now conducts the signal and produces another in opposite phase to the one produced by the stage 1. This opposite phase signal is then coupled to the input circuit of the stage 3 which serves to invert the signal produced by the stage 2. Thus, if it is assumed that one volt of signal voltage is connected to the input circuit 8, it is possible to derive a one volt output voltage from the stage 3 which is opposite in polarity.

With the two impedances 7 and 9 of equal values, the scale factor of the illustrated embodiment is said to have a value of unity, this scale factor being determined by means of the ratio of the value of impedance 7 to the value of impedance 9. At zero frequency, as is well known, this scale factor will determine the magnitude of the output voltage from stage 3.

Assuming that the scale factor is unity, with no drift voltages being developed in the overall circuit, the value of the voltage appearing on grid 10 of tube 4 will be approximately zero. This occurs since the impedances 7 and 9 on opposite sides of the control grid 10 are equal thereby dividing the potential differential between the input 8 and the output of stage 3 in half. In one arrangement, with one volt applied to terminals 8, a negative voltage of one volt will be derived from amplifier stage 3, thereby making the voltage on grid 10 zero.

Figure 2:
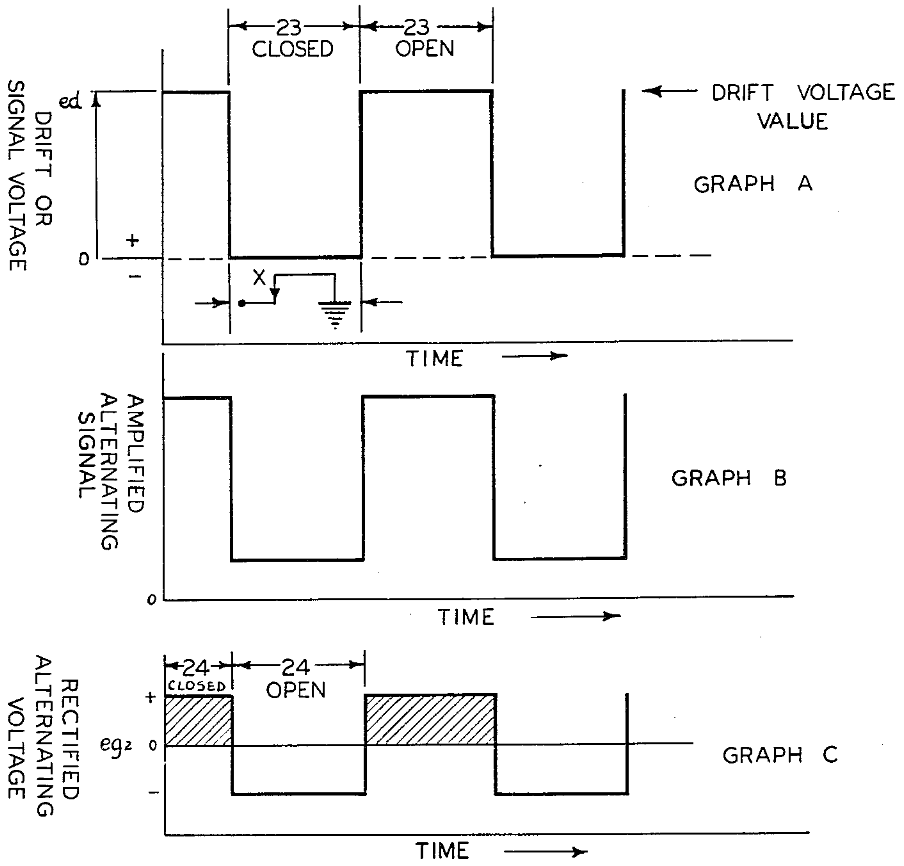
Fig. 2 shows illustrative waveforms derived from various points of the circuit of Fig. 1.

Now if it is assumed that a measurable drift voltage of positive polarity appears in the output circuit of the stage 3, this drift voltage is fed back to the grid 10 by means of the feed-back impedance 7. By operating the armature 22 alternately between the contacts 23 and 24, the grid 10 will have applied thereto alternating voltages characterized by the drift voltage when the armature 22 is not engaged with fixed contact 23, and by the ground potential when the armature 22 swings to contact 23. The alternating signal thereby applied to the grid 10 is graphically illustrated in Fig. 2 by graph "A," a depression in the waveform occurring when the switch 23 is closed, and the elevation occurring when the switch 23 is open.

During the period when the switch 23 is open, the tube 4 conducts more heavily thereby lowering the voltage on the anode 11 in accordance therewith. This lowered voltage is fed to the amplifier stage 2 which in turn conducts the signal through to its output circuit to provide a signal corresponding to that of graph "B" of Fig. 2. It should be noted that the variation of this signal conforms exactly to that applied to the control grid 10 of tube 4.

Next, this signal is fed back to the tube 5 through the condenser 28 which is a D. C. blocking condenser, the signal appearing on the side of the condenser adjacent the tube 5 being that indicated by graph "C" of Fig. 2, the important feature of this signal being that it appears as an alternating signal having a zero axis, which may be rectified.

Since this signal is connected to the fixed contact 24, with each occurrence of the positive half cycle, the armature 22 will be in contact with the contact 24 thereby grounding the latter. All of the positive lobes are then shunted to the ground, as indicated by the cross-hatched portions of graph "C" of Fig. 2, leaving only the negative lobes which are fed to the grid 19 of tube 5.

The combination of the resistor 29 and capacitor 30 acts as a smoothing filter to provide a substantially steady D. C. potential to the grid 19. With the application of the lowered bias on grid 19, the tube 5 becomes less conductive thereby reducing the current flowing through the cathode resistor 14. This reduced flow serves to reduce the bias on the control grid 10 or tube 4 thereby making this tube more conductive, and in effect supplementing the degree of conduction produced by the chopped drift voltage originally started with. This supplemented signal will then be conducted by amplifier stage 2, which inverts the signal condition existing on anode 11 of the tube 4, and feeds this to the output stage 3 through the filter 6. The filter 6 is designed so as to filter the pulsations produced by the chopper 22, 23, thereby providing an input signal for the stage 3 having a substantially pure D. C. characteristic. Now since a signal inversion occurs in stage 3, it is seen that the supplemented input to the stage 3 will result in a more negative signal being derived from stage 3 and fed back to the control grid 10 by the impedance 7. This negative feed-back signal being in opposite polarity to the original positive grid voltage which started the cycle, it is seen that the drift voltage may be compensated for and accurately nullified. The component parts of the entire circuit are so arranged and selected that for a given drift voltage appearing at grid 10, the cycling operation just explained will provide a feed-back voltage from the output stage 3 which is equal to but opposite in polarity from the drift voltage. The amplifier is then stabilized against any offset voltages which normally appear in amplifying direct current or low frequency signals.

Figure 3:
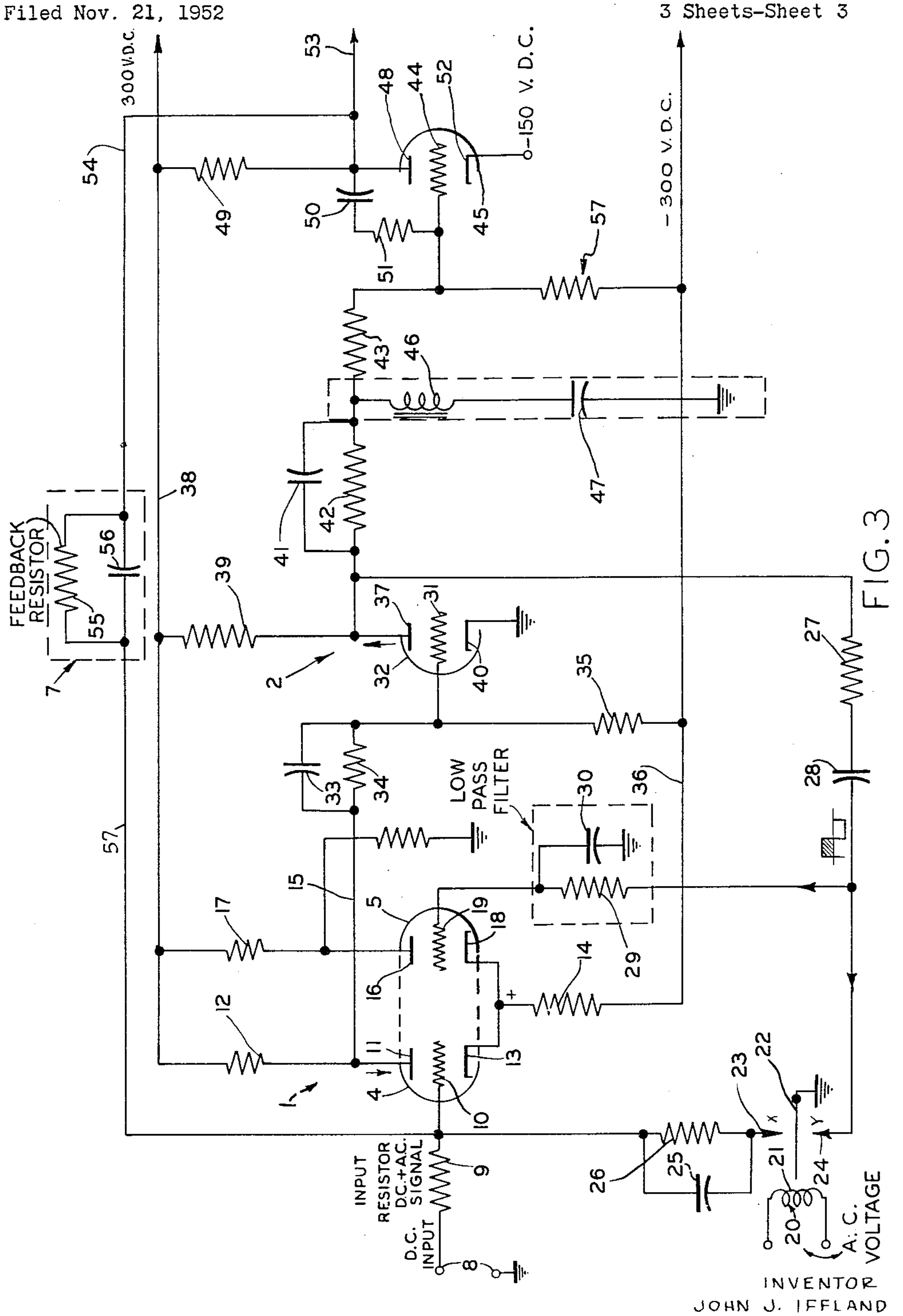
Fig. 3 is a complete circuit diagram of an amplifier which embodies the principles of this invention.

Referring to Fig. 3, a typical detailed circuit embodying the principles of this invention will be described. Since a portion of this diagram already appears in Fig. 1, only that portion which has not been described in detail for Fig. 1 needs to be described here.

The line 15 leading from the first stage 1 is coupled to the control grid 31 of triode 32 in amplifier stage 2 by means of capacitor 33 and resistor 34 connected in parallel. A resistor 35 connects grid 31 to a B minus line 36. The anode 37 of this tube 32 is connected to the B plus voltage line 38 by means of a plate resistor 39. The cathode 40 is grounded. The resistor 27, as described in connection with Fig. 1, has one end connected to anode 37 of tube 32, and this anode 37 is connected by means of a coupling network consisting of condenser 41, resistor 42, and resistor 43 to the control grid 44 of the tube 45 contained in the amplifier stage 3. A filter circuit consisting of a filter choke 46 and condenser 47 in series is connected between the juncture of the two resistors 42 and 43 and ground. As explained previously, the function of this filter circuit is to remove the alternating signal component, produced by the chopper 22, 23, of the signal which is amplified by the amplifier stage 2.

The anode 48 of tube 45 is connected to the B plus line 38 by means of plate resistor 49, and is also coupled back to the grid 44 by means of the series connected condenser 50 and resistor 51. The cathode 52 is connected to a source of negative potential, and in this particular embodiment to a source of minus 150 volts D. C. The output from the third stage is taken from the anode 48 and is indicated by the reference numeral 53. A line 54 couples this output circuit 53 to the feed-back impedance 7 consisting of a resistor 55 connected in parallel with a condenser 56. A line 57 connects the other side of this impedance 7 back to the control grid 10.

While it will be understood that the circuit specifications of the foregoing embodiment of this invention may vary according to design preferences, the following circuit specifications for such a circuit, are included, by way of example only, as suitable for a direct coupled amplifier circuit capable of producing continuously zero output potential for a value of zero volts input.

| Reference numeral: | Parts and Circuit description |
|---|---|
| 4 | ½ type 420A WE. |
| 5 | ½ type 420A WE. |
| 37 | ½ type 12AX7. |
| 45 | ½ type 12AU7. |
| 12 | 820,000 ohms. |
| 14 | 1 megohm. |
| 17 | 270,000 ohms. |
| 20 | 400 cycles. |
| 25 | 2000 mmf. |
| 26 | 1 megohm. |
| 28 | Blocking condenser. |
| 29 | 1 megohm. |
| 30 | 1 mf. |
| 33 | 50 mmf. |
| 34 | 1.2 megohms. |
| 35 | 3.3 megohms. |
| 39 | 560,000 ohms. |
| 41 | 100 mmf. |
| 42 | 3.9 megohms. |
| 43 | 100,000 ohms. |
| 46 | 5 henries. |
| 47 | .0132 mf. |
| 49 | 60,000 ohms. |
| 50 | 2000 mmf. |
| 51 | 2200 ohms. |
| 56 | 100 mmf. |
| 57 | 2.2 megohms. |

While there has been described what is at present considered the preferred embodiment of the invention, it will be abvious to those skilled in the art that various changes and modifications may be made therein without departing from the invention, and it is, therefore, aimed in the appended claims to cover all such changes and modifications as fall within the true spirit and scope of the invention.

What is claimed is:

1. A stabilized amplifier of the direct coupled type comprising a first amplifier stage, having first and second input circuits, a second amplifier stage having an output circuit, a third amplifier stage having input and output circuits, a direct coupling circuit connecting the first and second stages together, a filter circuit coupling the second stage to the input circuit of the third stage, a first feed-back impedance coupled between the output circuit of the third stage and the first input circuit of the first stage and operative to conduct a signal voltage from the third stage to said first stage, interrupting means also coupled to said first input circuit and operative to vary the amplitude of the voltage supplied to said first input circuit, a second feed-back impedance coupled between the output circuit of said second stage and the second input circuit of said first stage, and rectifying means operatively coupled to said second input circuit operative to rectify a voltage supplied by said second stage and to apply the rectified voltage to said second input circuit in such a manner that the rectified voltage will have a polarity which supplements the effect which said interrupting means has on said first input circuit, said filter circuit serving to prevent impulses produced by said interrupting means from being coupled to said third stage.

2. A stabilized amplifier of the direct coupled type comprising a first amplifier stage, having first and second input circuits, a second amplifier stage having an output circuit, a third amplifier stage having input and output circuits, a direct coupling circuit connecting the first and second stages together, a filter circuit coupling the second stage to the input circuit of the third stage, a first feed-back impedance coupled between the output circuit of the third stage and the first input circuit of the first stage and operative to conduct a signal voltage from the third stage to said first stage, interrupting means also coupled to said first input circuit and operative at a constant rate to switch said first input circuit alternately between said signal voltage and a reference potential, said first and second stages operative to carry alternating signals supplied to said first input circuit to the output circuit of said second stage, said filter serving to prevent said alternating signals from being communicated to said third stage, a second feed-back impedance coupled to the output circuit of said second stage and to said second input circuit of said first stage for coupling an alternating voltage corresponding to said alternating signals from said second stage to the second input circuit of said first stage, rectifying means coupled to said second input circuit and operative in synchronism with said interrupting means to prevent said alternating signals from being conducted to said second input circuit during the period said interrupting means is providing a connection between said first input circuit and said signal voltage, said first and second input circuits being so related that the rectified signal supplied to said second input circuit serves to supplement the signal voltage supplied to said first input circuit whereby all three stages are operative to conduct in accordance with the supplementing signal voltage and to supply to said first feed-back impedance a signal which is opposite in polarity to the supplemented signal voltage.

3. A stabilized amplifier of the direct coupled type comprising a first amplifier stage, having first and second input circuits, a second amplifier stage having an output circuit, a third amplifier stage having input and output circuits, a direct coupling circuit connecting the first and second stages together, a filter circuit coupling the second stage to the input circuit of the third stage, a first feed-back impedance coupled between the output circuit of the third stage and the first input circuit of the first stage and operative to conduct a signal voltage from said third stage to said first stage, interrupting means also coupled to said first input circuit and operative at a predetermined rate to interrupt alternately the coupling of said signal voltage to said first input circuit, said first and second stages operative to carry alternating signals supplied to said first input circuit to the output circuit of said second stage, said filter serving to prevent said alternating signals from being communicated to said third stage, a second feed-back impedance coupled between said second stage output circuit and said second input circuit for coupling an alternating voltage corresponding to said alternating signals from said second stage to said second input circuit, rectifying means coupled to said second input circuit and operative in synchronism with said interrupting means to prevent said alternating signals from being conducted to said second input circuit during the period said interrupting means is providing a connection between said first input circuit and said signal voltage, said first and second input circuits being so related that the rectified signal supplied to said second input circuit serves to supplement the signal voltage supplied to said first input circuit whereby all three stages are operative to conduct in accordance with the supplementing signal voltage and to supply to said first feed-back impedance a signal which is opposite in polarity to the supplemented signal voltage.

4. A stabilized amplifier of the direct coupled type comprising a first amplifier stage having first and second input circuits, a second amplifier stage having an output circuit, a third amplifier stage having input and output circuits, a direct coupling circuit connecting the first and second stages together, a filter circuit coupling the second stage to the input circuit of the third stage, a first feed-back impedance coupled between the output circuit of the third stage and the first input circuit of the first stage for conducting a signal voltage from said third stage to said first stage, interrupting means also coupled to said first input circuit and operative at a predetermined rate to switch said first input circuit alternately between said signal voltage and ground potential thereby supplying to said first input circuit alternating signals, said first and second stages operative to carry the alternating signals supplied to said first input circuit to the output circuit of said second stage, said filter serving to prevent said alternating signals from being communicated to said third stage, a second feed-back impedance coupled between the output circuit of said second stage and said second input circuit for coupling an alternating voltage corresponding to said alternating signals from said second stage to said second input circuit, rectifying means coupled to said second input circuit and operative in synchronism with said interrupting means to prevent said alternating signals from being conducted to said second input circuit during the period said interrupting means is providing a connection between said first input circuit and said signal voltage, said first and second input circuits being so related that the rectified signal supplied to said second input circuit serves to supplement the signal voltage supplied to said first input circuit whereby all three stages are operative to conduct in accordance with the supplementing signal voltage and to supply to said first feed-back impedance a signal which is opposite in polarity to the supplemented signal voltage.

5. A stabilized amplifier of the direct coupled type comprising a first amplifier stage having first and second input circuits, a second amplifier stage having an output circuit, a third amplifier stage having input and output circuits, a direct coupling circuit connecting the first and second stages together, a filter circuit coupling the second stage to the input circuit of the third stage, a first feed-back impedance coupled between the output circuit of the third stage and the first input circuit of the first stage and operative to conduct a signal voltage from said third stage to said first input circuit, a synchronous switch having two fixed contacts and a movable armature which is interposed between and selectively engageable with said contacts, said armature being connected to ground potential for grounding selectively said fixed contacts, one of said fixed contacts being connected to said first input circuit whereby vibratory movement of said armature between said contacts serves to impress on said first input circuit alternately ground potential and said signal voltage to provide alternating signals for said first input circuit, said first and second stages operative to carry the alternating signals supplied to said first input circuit to the output circuit of said second stage, said filter serving to prevent said alternating signals from being communicated to said third stage, a second feed-back impedance coupled between said second stage and the second input circuit of said first stage for feeding the latter stage an alternating voltage corresponding to said alternating signals, the other of said two fixed switch contacts being coupled to said second input circuit and operative in cooperation with said armature to impress on said second input circuit alternately ground potential and said alternating voltage derived from said second stage whereby said alternating voltage is rectified and fed to said second input circuit, said first and second input circuits being so related that the rectified signal supplied to said second input circuit serves to supplement the signal voltage supplied to said first input circuit whereby all three stages are operative to conduct in accordance with the supplementing signal voltage and to supply said first feed-back impedance a signal which is opposite in polarity to the supplemented signal voltage.

6. A stabilized amplifier of the direct coupled type comprising a first amplifier stage having first and second input circuits, a second amplifier stage having an output circuit, a third amplifier stage having input and output circuits, a direct coupling circuit connecting the first and second stages together, a filter circuit coupling the second stage to the input circuit of the third stage, a first feedback impedance coupled between the output circuit of the third stage and the first input circuit of the first stage and operative to conduct a signal voltage from the third stage to said first input circuit, a synchronous switch having two fixed contacts and a movable armature which is interposed between and selectively engageable with said contacts, said armature being connected to ground potential for grounding selectively said fixed contacts, one of said fixed contacts being connected to said first input circuit whereby vibratory movement of said armature between said contacts serves to supply said first input circuit alternately ground potential and said signal voltage to provide alternating signals for said first input circuit, said first and second stages operative to carry the alternating signals supplied to said first input circuit to the output circuit of said second stage, said filter serving to prevent said alternating signals from being communicated to said third stage, a second feed-back impedance coupled between said second stage and said second input circuit for coupling said alternating signals from said second stage to said second input circuit, said second impedance including a condenser connected in series between said second stage and said second input circuit, for providing an alternating voltage corresponding to said alternating signals, the other of said two fixed switch contacts being coupled to said second input circuit and operative in cooperation with said armature to impress on said second input circuit alternately ground potential and the alternating voltage whereby said voltage is rectified and fed to said second input circuit, said first and second input circuits being so related that the rectified signal supplied to said second input circuit serves to supplement the signal voltage supplied to said first input circuit whereby all three stages are operative to conduct in accordance with the supplementing signal voltage and to supply said first feed-back impedance a signal which is opposite in polarity to the supplemented signal voltage.

7. A stabilized amplifier of the direct coupled type comprising a first amplifier stage having first and second input circuits, a second amplifier stage having an output circuit, a third amplifier stage having input and output circuits, a direct coupling circuit connecting the first and second stages together, a filter circuit coupling the second stage to the input circuit of the third stage, a first feed-back impedance coupled between the output circuit of the third stage and the first input circuit of the first stage and operative to conduct a signal voltage from said third stage to said first stage, a synchronous switch having two fixed contacts and a movable armature which is interposed between and selectively engageable with said contacts, said armature being connected to ground potential for grounding selectively said fixed contacts, one of said fixed contacts being connected to said first input circuit whereby vibratory movement of said armature between said contacts serves to apply to said first input circuit alternately ground potential and said signal voltage to provide alternating signals for said first input circuit, said first and second stages operative to carry the alternating signals supplied to said first input circuit to the output circuit of said second stage, said filter serving to prevent said alternating signals from being communicated to said third stage, a second feed-back impedance coupled between said second stage and said second input circuit for coupling said alternating signals from said second stage to said second input circuit and including a condenser connected in series between said second stage and said second input circuit for providing an alternating voltage corresponding to said alternating signals, the other of said two fixed switch contacts being coupled to said second input circuit and operative in cooperation with said armature to impress on said second input circuit alternately ground potential and the alternating voltage whereby said alternating voltage is rectified and fed to said second input circuit, a low pass filter also coupled to said second input circuit for smoothing the rectified signals into direct current potential, said first and second input circuits being so related that the rectified signal supplied to said second input circuit serves to supplement the signal voltage supplied to said first input circuit whereby all three stages are operative to conduct in accordance with the supplementing signal voltage and to supply said first feed-back impedance a signal which is opposite in polarity to the supplemented signal voltage.

8. A stabilized amplifier of the direct coupled type comprising first amplifying means having first and second input circuits, second amplifying means operatively coupled to said first means, third amplifying means operatively coupled to said second means, a first feed-back impedance coupled between said third means and said first input circuit and operative to conduct a signal voltage from the third means to said first means, interrupting means also coupled to said first input circuit and operative to vary the amplitude of the voltage supplied to said first input circuit, a second feed-back impedance coupled between said second means and the second input circuit for coupling a signal voltage from said second means to said second input circuit, and rectifying means operatively coupled to said second input circuit operative to rectify a voltage supplied by said second stage and to apply the rectified voltage to said second input circuit in such a manner that the rectified voltage will have a polarity which supplements the effect which said interrupting means has on said first input circuit.

References Cited in the file of this patent

UNITED STATES PATENTS 2,619,552 Kearns ---------------- Nov. 25, 1952

OTHER REFERENCES

Electronics, pages 144–148, April 1952.